United States Patent
Branover et al.

(10) Patent No.: US 10,304,506 B1
(45) Date of Patent: May 28, 2019

(54) DYNAMIC CLOCK CONTROL TO INCREASE STUTTER EFFICIENCY IN THE MEMORY SUBSYSTEM

(71) Applicants: Advanced Micro Devices, Inc., Sunnyvale, CA (US); ATI Technologies ULC, Markham (CA)

(72) Inventors: Alexander J. Branover, Chestnut Hill, MA (US); Benjamin Tsien, Fremont, CA (US); Bradley Kent, North York (CA); Joyce C. Wong, Toronto (CA)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 0 days.

(21) Appl. No.: 15/809,608

(22) Filed: Nov. 10, 2017

(51) Int. Cl.
- *H03L 7/06* (2006.01)
- *G11C 7/22* (2006.01)
- *G06F 13/16* (2006.01)
- *G11C 7/20* (2006.01)

(52) U.S. Cl.
CPC .......... *G11C 7/222* (2013.01); *G06F 13/1668* (2013.01); *G11C 7/20* (2013.01)

(58) Field of Classification Search
CPC ...... G06F 1/3287; G06F 1/324; G06F 1/3237; G06F 1/3296
See application file for complete search history.

(56) References Cited

U.S. PATENT DOCUMENTS

| | | |
|---|---|---|
| 5,553,223 A | 9/1996 | Greenlee et al. |
| 5,706,502 A | 1/1998 | Foley et al. |
| 5,761,513 A | 6/1998 | Yellin et al. |
| 5,815,653 A | 9/1998 | You et al. |
| 5,923,885 A | 7/1999 | Johnson et al. |
| 6,058,393 A | 5/2000 | Meier et al. |
| 6,119,247 A | 9/2000 | House et al. |
| 6,138,140 A | 10/2000 | Yokote |

(Continued)

FOREIGN PATENT DOCUMENTS

WO 96/38791 12/1996

OTHER PUBLICATIONS

Tsien et al., U.S. Appl. No. 15/725,912, entitled "Dynamic Control of Multi-Region Fabric", filed Oct. 5, 2017, 29 pages.

(Continued)

*Primary Examiner* — Sibin Chen
(74) *Attorney, Agent, or Firm* — Meyertons Hood Kivlin Kowert and Goetzel PC; Rory D. Rankin

(57) ABSTRACT

Systems, apparatuses, and methods for implementing dynamic clock control to increase stutter efficiency in a memory subsystem are disclosed. A system includes at least a processor, a memory, and a communication fabric coupled to the processor and memory. The system implements a stutter mode for a first region of the fabric, with stutter mode including an idle state and an active state. Stutter efficiency is defined as the idle time divided by the sum of the active time and the idle time. Reducing the exit latency of going from the idle state to the active state increases the stutter efficiency which increases the power savings achieved by implementing the stutter mode. Since the phase-locked loop (PLL) is one of the main contributors to the exit latency, the PLL is powered down and one or more bypass clocks are provided during the stutter mode.

20 Claims, 9 Drawing Sheets

(56) References Cited

U.S. PATENT DOCUMENTS

| | | |
|---|---|---|
| 6,618,854 B1 | 9/2003 | Mann |
| 6,760,838 B2 | 7/2004 | Owen et al. |
| 6,950,886 B1 | 9/2005 | Bailey |
| 7,093,153 B1 | 8/2006 | Witek et al. |
| 9,541,984 B2 | 1/2017 | Wen et al. |
| 9,971,700 B2 | 5/2018 | Loh |
| 9,983,652 B2 | 5/2018 | Piga et al. |
| 2002/0083254 A1 | 6/2002 | Hummel et al. |
| 2004/0215986 A1 | 10/2004 | Shakkarwar |
| 2005/0097184 A1* | 5/2005 | Brown ................ G06F 12/0692 709/213 |
| 2008/0126750 A1 | 5/2008 | Sistla |
| 2011/0119526 A1 | 5/2011 | Blumrich et al. |
| 2011/0219208 A1 | 9/2011 | Asaad et al. |
| 2013/0083611 A1* | 4/2013 | Ware ................... G11C 11/4072 365/191 |
| 2014/0160106 A1* | 6/2014 | Choi ..................... G09G 5/363 345/212 |
| 2014/0192583 A1 | 7/2014 | Rajan et al. |
| 2014/0232731 A1 | 8/2014 | Holland et al. |
| 2015/0120978 A1 | 4/2015 | Kalyanasundharam et al. |

OTHER PUBLICATIONS

Smith et al., U.S. Appl. No. 15/728,191, entitled "Method and Apparatus for In-Band Priority Adjustment Forwarding in a Communication Fabric", filed Oct. 9, 2017, 29 pages.
International Search Report and Written Opinion in International Application No. PCT/US2018/051615 dated Dec. 21, 2018, 13 pages.

* cited by examiner

US 10,304,506 B1

DYNAMIC CLOCK CONTROL TO INCREASE STUTTER EFFICIENCY IN THE MEMORY SUBSYSTEM

BACKGROUND

Description of the Related Art

Computing systems are increasingly integrating large numbers of different types of components on a single chip or on a multi-chip module. The complexity and power consumption of a system increases with the number of different types of components. Often, these components are connected together via switches, routers, communication buses, bridges, buffers, controllers, coherent devices, and other links. The combination of these interconnecting components is referred to herein as a "communication fabric", or "fabric" for short. Generally speaking, the fabric facilitates communication by routing messages between a plurality of components on an integrated circuit (i.e., chip) or multi-chip module. Examples of messages communicated over a fabric include memory access requests, status updates, data transfers, coherency probes, coherency probe responses, and the like.

Power management is an important aspect of the design and operation of integrated circuits, especially those circuits that are integrated within mobile devices. Mobile devices typically rely on battery power, and reducing power consumption in the integrated circuits can increase the life of the battery as well as decrease the heat generated by the integrated circuits. One technique for reducing power consumption is to have an integrated circuit operate in different modes depending on the activity levels of the mobile device or computing system. Transitioning an integrated circuit between operating modes typically involves multiple steps. These steps can include powering up and locking a phase-locked loop (PLL), powering up or powering down one or more other components of the fabric, the memory controller, and/or other components on a data path to memory. The amount of time it takes to perform these steps affects both the efficiency of mode transitions and the power consumption of the integrated circuit.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF EMBODIMENTS

Figure 1:
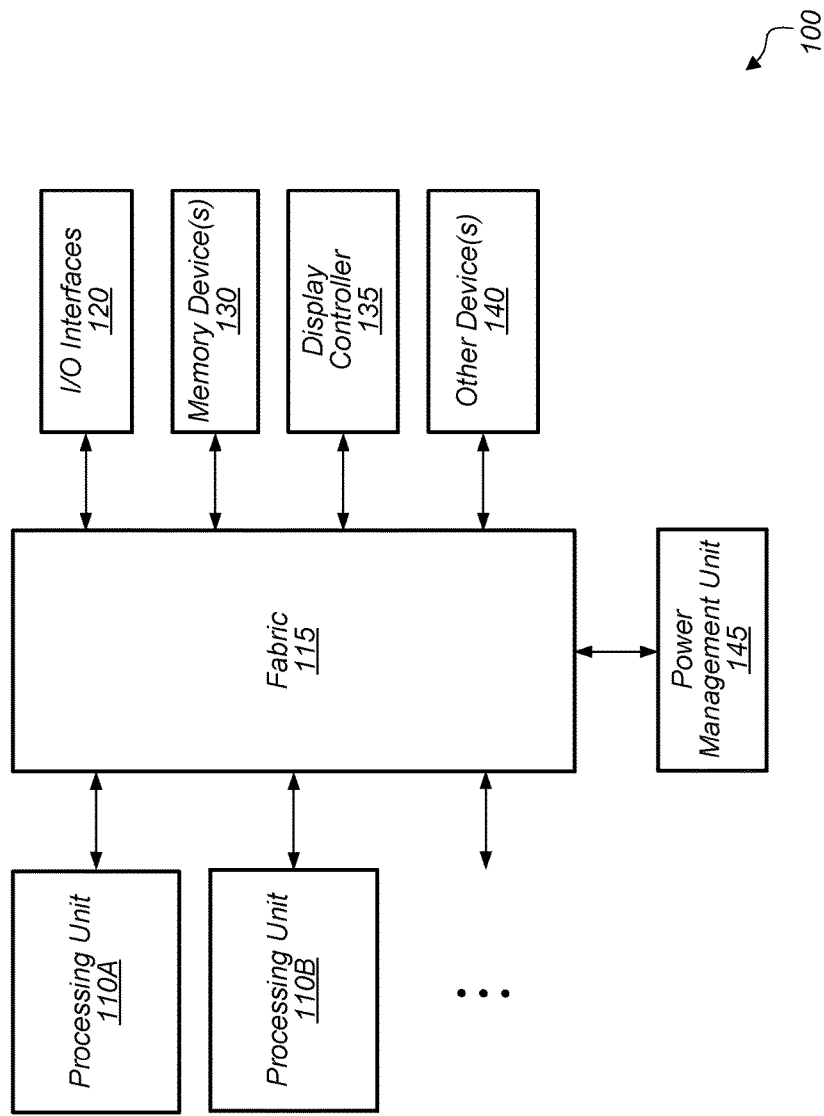
FIG. 1 is a block diagram of one embodiment of a computing system.

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for implementing dynamic clock control to increase stutter efficiency in the memory subsystem are disclosed herein. In one embodiment, a system includes at least one or more processing units, one or more input/output (I/O) interfaces, a multi-region fabric, and one or more memory devices. In one embodiment, the fabric is partitioned into at least a first region and a second region, with the first region classified as a stutter region and the second region classified as a non-stutter region. The stutter region refers to fabric components servicing predictable, periodic clients and the non-stutter region refers to fabric components servicing unpredictable, non-periodic clients. The traffic generated by clients in the stutter region is referred to as "stutter traffic". Stutter traffic includes traffic generated by long duration workloads such as during a static screen, video or audio playback, or others. Non-stutter traffic includes traffic generated by workloads such as keyboard/mouse responses, background processes, intensive central processing unit (CPU) or graphics processing unit (GPU) compute tasks, or others. In one embodiment, when a power-gating condition is detected, all regions of the fabric are power-gated. Then, the fabric periodically turns on the stutter region to process any requests from the stutter client(s) while maintaining the non-stutter region in power-gated mode.

In one embodiment, the methods and mechanisms described herein may operate in a stutter mode. Stutter mode refers to a mode when a region of the fabric is put into a reduced-power state (e.g., power-gated mode) and then the region is periodically woken up from the reduced power state to service clients. This region can be referred to as a stutter region. When a power-gating condition is detected, the fabric is put into stutter mode. For example, the decision to enter stutter mode can be made based on detecting a lack of activity of clients sharing the fabric. A non-stutter mode is when the fabric is powered up and ready to process requests from any clients. In various embodiments, the stutter mode may include at least two separate states, a stutter idle state and a stutter active state. During the stutter idle state, the stutter region(s) are powered down. During the stutter active state, the stutter region(s) are woken up to service stutter clients. In one embodiment, stutter mode starts in the stutter idle state. Stutter efficiency is defined as the stutter idle time divided by the sum of stutter active time and stutter idle time. Reducing the exit latency of going from the stutter idle state to the stutter active state increases the stutter efficiency which increases the power savings from implementing the stutter mode. Since the phase-locked loop (PLL) is one of the main contributors to the exit latency, the PLL is powered down and one or more bypass clocks are provided during the stutter mode.

In one embodiment, during stutter mode, a low-power, bypass clock is provided to clock one or more components of the fabric. The low-power, bypass clock can also be provided to clock other components (e.g., memory controller, memory physical interface circuit (PHY)). During stutter mode, the PLL providing a clock to one or more components of the fabric is powered down. When a region of the fabric wakes up to service one or more stutter clients during the stutter active phase, the PLL stays powered down and the low-power, bypass clock is provided to those components that typically rely on a clock generated by the PLL. In one embodiment, the bypass clock runs at a predefined frequency.

Referring now to FIG. 1, a block diagram of one embodiment of a computing system 100 is shown. In one embodiment, computing system 100 includes at least processing units 110A-B, fabric 115, input/output (I/O) interfaces 120, memory device(s) 130, display controller 135, other device(s) 140, and power management unit 145. In other embodiments, computing system 100 can include other components and/or computing system 100 can be arranged differently. Processing units 110A-B are representative of any number and type of processing units. For example, in one embodiment, processing unit 110A is a central processing unit (CPU) and processing unit 110B is a graphics processing unit (GPU). In other embodiments, processing units 110A-B can include other numbers and types of processing units (e.g., digital signal processor (DSP), field programmable gate array (FPGA), application specific integrated circuit (ASIC)).

Fabric 115 is representative of any communication interconnect and any protocol utilized for communicating among the components of the system 100. Fabric 115 provides the data paths, switches, routers, multiplexers, controllers, and other logic that connect the processing units 110A-B, I/O interfaces 120, memory device(s) 130, display controller 135, and other device(s) 140 to each other. Fabric 115 handles the request, response, and data traffic, as well as probe traffic to facilitate coherency. Fabric 115 also handles interrupt request routing and configuration access paths to the various components of system 100. Fabric 115 can be bus-based, including shared bus configurations, crossbar configurations, and hierarchical buses with bridges. Fabric 115 can also be packet-based, and can be hierarchical with bridges, crossbar, point-to-point, or other interconnects. From the point of view of fabric 115, the other components of system 100 can be referred to as "clients". Fabric 115 is configured to process requests generated by various clients and pass the requests on to other clients.

In one embodiment, fabric 115 is partitioned into a plurality of regions, with each region representing a different power-gating domain. For example, in one embodiment, a first region is a stutter region which processes unpredictable and/or non-periodic clients and a second region is a non-stutter region which processes predictable and/or periodic clients. In this embodiment, when fabric 115 is power-gated, the stutter region of fabric 115 wakes up periodically to process requests from one or more clients while the non-stutter region remains power-gated. In other embodiments, fabric 115 can be partitioned into other numbers and types of regions representing different power-gating domains.

It is noted that the predictable and/or periodic clients can also be referred to as "stutter clients". Additionally, the region(s) of fabric 115 which process stutter clients can be referred to as "stutter region(s)". For example, a stutter client can be a client that generates a burst of requests targeting memory device(s) 130 and then goes into an idle mode following the burst of requests. Scenarios where stutter clients are active include static screen display scenarios, video playback scenarios, and other traffic generation behavior which is bursty followed by periods of idle behavior. For example, a static screen display scenario refers to periodically accessing the display data (e.g., frame buffer) for the purpose of refreshing the display surface. In another example, a video playback scenario involves decoding by dedicated engines and display controller 135 fetching decoded images from the frame buffer and outputting the images to the display. The video playback scenario can result in the stutter regions of fabric 115 being woken up periodically to handle the traffic from dedicated engines and display controller 135 and then the stutter regions of fabric 115 can return to the power-gated mode.

In general, fabric 115 is partitioned into a plurality of regions based on the different types of traffic being generated for the expected workloads or use cases of system 100. The partitioning of fabric 115 can be optimized for these expected workloads, such that the number of regions and the logic contained in each region will result in some portions of the fabric 115 remaining in power-gated mode while other portions of the fabric 115 are woken up periodically to service stutter clients. In some embodiments, fabric 115 can have a single stutter region while in other embodiments, fabric 115 can have multiple different stutter regions which wake up at different intervals. Portions of the fabric that need to wake up on similar intervals can be grouped together into a single stutter region. Other portions of the fabric that process unpredictable and/or non-periodic clients can be grouped together into the other region(s) which will remain power-gated while the stutter regions wake up on their different intervals. Non-stutter scenarios with activity by non-stutter clients include universal serial bus (USB) transfers, interrupts being processed by a CPU, an application being opened, direct memory access (DMA) transfers, and the like. In some cases, stutter clients do not necessarily need to be grouped into one of the stutter regions. For example, in one embodiment, a low frequency stutter client can be grouped with the non-stutter clients.

In one embodiment, power management unit 145 is configured to manage the power-gating of regions of fabric 115 and the waking up of stutter regions on a periodic basis. As used herein, the terms "power-gate" and "power down" are defined as reducing the power consumption of one or more components. The terms "power-gate" and "power down" can also be defined as putting a region or multiple regions of the fabric into a low power state. The term "power up" is defined as increasing the power consumption of one or more components. More generally, the term "power up" can be defined as returning the one or more components to normal operation after being in a low power state. A "low power state" as defined herein can be a state in which a voltage supplied to the component(s) of the region is reduced from its maximum, a state in which the frequency of the clock signal is reduced, a state in which the clock signal is inhibited from the component(s) (clock-gated), one in which power is removed from the component(s), or a combination of any of the former.

In one embodiment, fabric 115 is configured to optimize the efficiency of the stutter regions entering and exiting a low power state. The efficiency of the stutter regions entering and exiting a low power state can also be referred to as "stutter efficiency". The stutter efficiency is defined as the amount of time spent in stutter idle mode divided by the sum of the amount of time spent in stutter active mode and the amount of time spent in stutter idle mode. Said another way, stutter efficiency is the ratio of the stutter-idle phase to the overall stutter interval. During the stutter-active mode, memory clients, such as the display controller 135, are accessing the memory 130. In one embodiment, it is desired to optimize the stutter efficiency of system 100 without increasing the cost of system 100.

In one embodiment, stutter efficiency is optimized by reducing an exit latency of the stutter idle state into the stutter active state. In one embodiment, reducing the exit latency allows the display controller 135 to access the memory 130 faster, which helps to reduce the active component of the stutter interval. Exit latency can involve a number of steps, such as turning on a memory physical interface circuit (PHY) of fabric 115, re-locking the memory PHY phase-locked loop (PLL), powering up the memory controller, turning on fabric 115 power for those components on the path from display controller 135 to memory 130, and turning on and re-locking the fabric PLL. Each of these steps contributes some number of microseconds and negatively affects the stutter efficiency.

In one embodiment, stutter efficiency is increased by utilizing a bypass clock in place of the clock generated by the fabric PLL during the entirety of the stutter mode interval. Since the bypass clock is utilized in stutter mode, the fabric PLL and/or fabric frequency synthesizer are kept in the off state (i.e., power-gated state) for the entire duration of the stutter mode interval. By keeping the fabric PLL in the power-gated state during stutter mode, this saves the time associated with turning on and re-locking the fabric PLL. The bypass clock can remain available for as long as applications are running in system 100. The memory bandwidth provided by the bypass clock is equal to the speed of the bypass clock multiplied by the width of the fabric data path in system 100. For example, a bypass clock running at 400 megahertz (MHz) addresses bandwidth requirements of up to 12.8 gigabytes (GB) per second for a fabric data path of 32 bytes. The bypass clock can be changed to a higher frequency when higher bandwidth is required. In some embodiments, multiple bypass clocks are available for fabric 115 during the stutter mode. When fabric 115 is not in stutter mode, the bypass clock(s) can be turned off or divided to a low value. In another embodiment, the PHY PLL is also turned off and a bypass clock is used for the memory PHY. In this embodiment, the stutter idle exit latency is reduced even further since there is no need to re-lock the PHY PLL. Power consumption is also reduced even further since the PHY PLL is off for the entire duration of the application.

In one embodiment, the decision to enter stutter mode is made based on detecting a lack of activity (i.e., idleness) of clients sharing fabric 115. For some latency sensitive clients (e.g., image signal processing client, universal serial bus (USB) client), a notification can indicate that their respective buffers are full enough to enter stutter mode. In other embodiments, a voting table can specify which clients need to be tracked for determining when to enter stutter mode. In one embodiment, system 100 includes a register flag to indicate when stutter mode has been initiated. Also, system 100 can generate an interrupt or other notification to various clients when entering stutter mode. In one embodiment, when system 100 is in stutter mode, determining when to transition between the stutter idle state and stutter active state is based on the status of display controller 135. For example, in one embodiment, when the occupancy of buffer of display controller 135 is above a first threshold, system 100 can enter stutter idle state. Once the buffer occupancy falls below a second threshold, system 100 exits stutter idle mode and transitions into stutter active mode. In another embodiment, when the display panel buffer is full, which can happen during panel self-refresh mode, system 100 can enter stutter idle state.

In one embodiment, the frequency of the bypass clock is predefined. For example, in one embodiment, the bypass clock is 400 MHz. By using the bypass clock, the PLL and/or frequency synthesizer and one or more other components can remain powered down when the stutter regions of the fabric periodically wake up to service the stutter clients. This avoids the exit latency of powering up and re-locking the PLL. Additionally, as long as the workload that is running does not require bandwidth of a special frequency only able to be generated by the PLL, the PLL can remain off, and the bypass clock can continue to run those portions of the fabric typically run by the PLL. Accordingly, if the frequency of the bypass clock multiplied by the data path width of the fabric can provide enough bandwidth for the workload that is running, when the fabric exits stutter mode, the PLL can remain off and the bypass clock can continue to run the fabric. Running the fabric in bypass mode optimizes stutter efficiency, because the PLL does not need to be re-locked on every entry into the stutter active state. This results in a reduction of the overall power consumption of fabric 115 and of system 100.

In one embodiment, fabric 115 dynamically controls which bypass clocks are needed, based on the application that is running. Depending on the use case, the other unneeded bypass clocks can be completely turned off. While the PLL is able to generate clocks at frequencies with a fine granularity, the bypass clock is typically set at one or more fixed frequencies spaced at coarse granularity. For example, if fabric 115 includes four bypass clocks, fabric 115 can turn off, at the source, three of the bypass clocks that are not needed, leaving the one bypass clock to run the stutter regions of fabric 115. In one embodiment, the fabric PLL and the memory controller PLL are turned off during stutter mode when the bypass clock is controlling operation of fabric 115 and the memory controller. In another embodiment, the PHY PLL is also turned off during stutter mode when the bypass clock is controlling operation of the fabric, memory controller, and the memory PHY.

Memory device(s) 130 are representative of any number and type of memory devices. For example, the type of memory in memory device(s) 130 can include Dynamic Random Access Memory (DRAM), Static Random Access Memory (SRAM), NAND Flash memory, NOR flash memory, Ferroelectric Random Access Memory (FeRAM), or others. Memory device(s) 130 are accessible by processing units 110A-B, I/O interfaces 120, display controller 135, and other device(s) 140 via fabric 115. I/O interfaces 120 are representative of any number and type of I/O interfaces (e.g., peripheral component interconnect (PCI) bus, PCI-Extended (PCI-X), PCIE (PCI Express) bus, gigabit Ethernet (GBE) bus, universal serial bus (USB)). Various types of peripheral devices can be coupled to I/O interfaces 120. Such peripheral devices include (but are not limited to) displays, keyboards, mice, printers, scanners, joysticks or other types of game controllers, media recording devices, external storage devices, network interface cards, and so forth. Other device (s) 140 are representative of any number and type of devices (e.g., multimedia device, video codec).

In various embodiments, computing system 100 can be a computer, laptop, mobile device, server or any of various other types of computing systems or devices. It is noted that the number of components of computing system 100 can vary from embodiment to embodiment. There can be more or fewer of each component than the number shown in FIG. 1. It is also noted that computing system 100 can include other components not shown in FIG. 1. Additionally, in other embodiments, computing system 100 can be structured in other ways than shown in FIG. 1.

Figure 2:
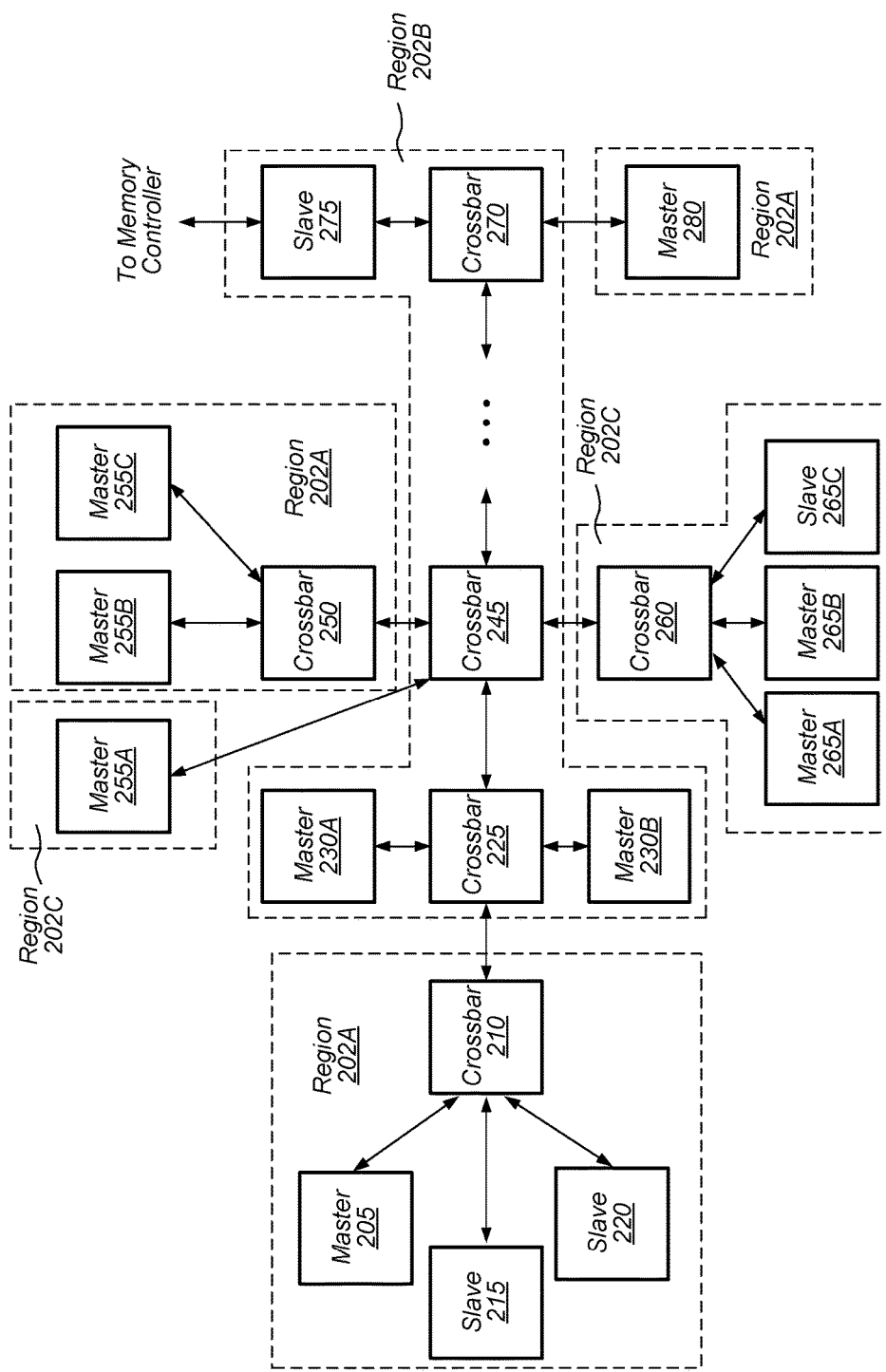
FIG. 2 is a block diagram of one embodiment of a multi-region fabric.

Turning now to FIG. 2, a block diagram of one embodiment of a multi-region fabric 200 is shown. In one embodiment, fabric 200 can be implemented as fabric 115 of computing system 100 (of FIG. 1). In one embodiment, fabric 200 is partitioned into a plurality of regions 202A-C. Regions 202A-C are representative of any number of regions, with any number of components per region and any type of topology for each region. As shown in FIG. 2, there are three separate regions 202A-C, although these regions 202A-C are scattered about the topology of fabric 200. In other words, a given region 202A-C does not have to be contiguous within fabric 200.

In one embodiment, each region 202A-C of fabric 200 is associated with a different power-gating domain. For example, region 202A is associated with a first power-gating domain, region 202B is associated with a second power-gating domain, and region 202C is associated with a third power-gating domain. In one embodiment, region 202C is a non-stutter region and region 202C is placed in a power-gated state for longer periods of time than regions 202A-B. In other embodiments, fabric 200 can include other numbers and types of regions, with each region associated with a separate power domain.

Each region 202A-C of fabric 200 includes one or more components that are included within the respective region. Region 202A includes master 205 and slaves 215 and 220 coupled to crossbar 210. As used herein, a "master" is defined as a component that generates requests, and a "slave" is defined as a component that services requests. Region 202A also includes crossbar 250, master 255B, and master 255C. Region 202A also includes master 280. In one embodiment, every dashed block of fabric 200 labeled as region 202A is included within a single power-gating domain of fabric 200. This power-gating domain is power-gated as a group, such that every component in a dashed block labeled as region 202A is power-gated together and is brought out of power-gating mode together.

Other components of fabric 200 are considered to be part of regions 202B-C. For example, crossbar 225, master 230A, master 230B, crossbar 245, crossbar 270, and slave 275 are included within region 202B. In one embodiment, slave 275 is coupled to a memory controller. In one embodiment, region 202B is treated as a stutter region, and the clients coupled to components in region 202B are referred to as "stutter clients". A stutter client is a client which exhibits predictable and/or periodic behavior such that traffic is generated on a periodic basis. In one embodiment, region 202C is also treated as a stutter region, although region 202C can have a different periodicity than region 202B. Region 202C includes master 255A. Region 202C also includes crossbar 260, masters 265A-B, and slave 265C. In one embodiment, when fabric 200 is placed into power-gating mode, regions 202A, 202B, and 202C are power-gated. Then, fabric 200 will turn region 202B back on periodically on a first periodic interval to process any pending requests from its stutter clients. Fabric 200 can also turn region 202C back on periodically on a second periodic interval to process any pending requests from its stutter clients. When fabric 200 turns region 202B or region 202C back on, fabric 200 keeps region 202A in the power-gated mode to reduce power consumption. Accordingly, region 202B or region 202C is powered on to process requests from stutter clients but region 202A remains in power-gated mode. This allows fabric 200 to continue to save some power by keeping some of fabric 200 in the power-gated mode while processing requests from stutter clients.

In one embodiment, fabric 200 can utilize one or more bypass clock signals when turning region 202B or region 202C back on to process any pending requests from their stutter clients. In non-stutter mode, a first clock circuit (e.g., a first PLL) provides a first clock signal to the components of region 202B. This first clock circuit is powered down during stutter mode, and then the bypass clock signal is utilized to clock the components of region 202B when region 202B is turned back on to process requests from its stutter clients. Similarly, region 202C can be supplied with a bypass clock signal when region 202C is in stutter-mode to allow a second clock circuit to be powered down during stutter mode. By using bypass clocks during stutter mode, the first and second clock circuits can stay powered down and the transition time for turning regions 202B and 202C back on is reduced.

It is noted that the various crossbars 210, 225, 245, 250, 260, and 270 which are part of fabric 200 can also be referred to as switches or routers. A crossbar can include switch connections and buffering to buffer requests which are received by the crossbar. A crossbar can also include credit control logic to implement a flow control mechanism for transmitting requests from source to destination. Each crossbar allows for requests to connect from any source to any of the destinations coupled to the crossbar. Each crossbar also includes one or more connections to other crossbars to enable requests to be sent to other destinations which are not directly coupled to the respective crossbar.

Figure 3:
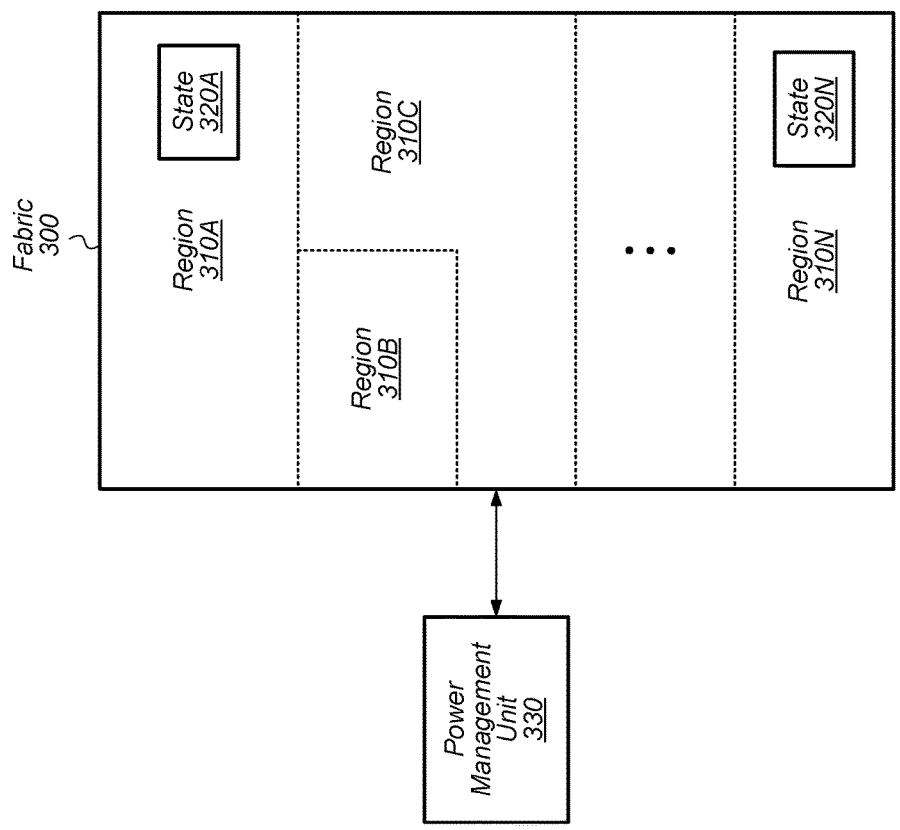
FIG. 3 is a block diagram of another embodiment of a multi-region fabric.

Referring now to FIG. 3, a block diagram of another embodiment of a multi-region fabric 300 is shown. In various embodiments, fabric 300 can be implemented as fabric 115 of system 100 (of FIG. 1) or as the communication fabric of other computer systems. In one embodiment, fabric 300 is partitioned into a plurality of regions 310A-N. The number and topology of regions 310A-N can vary according to the embodiment. The number of components per region 310A-N can also vary from region to region and from embodiment to embodiment. In general, one or more of regions 310A-N can be classified as stutter regions and the other regions 310A-N can be classified as non-stutter regions. The classification of regions as stutter or non-stutter regions can be determined based on the type of clients and/or the traffic types that are serviced by these regions.

In one embodiment, fabric 300 is partitioned into regions based on an analysis of the various types of clients within the host computing system and the predictability or unpredictability of their traffic generation behavior. For example, clients that generate requests at a common interval can be classified as a single group, and components of fabric 300 which process requests from this group of clients can be grouped together into a common region of fabric 300. When fabric 300 is power-gated, a given region can exit from the power-gated mode on a periodic basis to check for requests from their clients. Each region can utilize a different periodic basis for checking for requests from corresponding clients. The periodic basis which is utilized for checking for requests can also be determined based on an analysis of the host computing system and the expected workloads. The frequency with how often each region of fabric 300 is woken up to check for requests from their clients is programmable and can be dynamically adjusted by fabric 300 and/or the host system.

In one embodiment, in order to reduce the latency of transitioning between power-gated mode and powered-on mode for certain regions, one or more regions store some saved state in always on flops to help make the transition occur more quickly. For example, region 310A includes state 320A, which is stored state for one or more of the components of region 310A. The stored state 320A can include address maps, routing tables, buffer allocation information, configuration data, and the like. Also, region 310N includes state 320N, which is stored state for one or more of the components of region 310N. Any number of other regions can also include some stored information to help reduce the time needed for transitioning between power-gated mode and powered-on mode.

In one embodiment, fabric 300 is coupled to power management unit 330. In another embodiment, power management unit 330 is included as part of fabric 300. In one embodiment, power management unit 300 is a partition-aware unit that recognizes the different regions of fabric 300 and manages each region independently of the other regions. In one embodiment, power management unit 300 is configured to control the power modes of the various regions 310A-N of fabric 300. For example, power management unit 330 puts one or more regions 310A-N into power-gated mode and periodically takes one or more regions 310A-N out of power-gated mode. To put a given region 310 into power-gated mode, power management unit 330 can reduce or shut off the supply voltage(s) and/or clock(s) being supplied to the given region 310. To bring a given region 310 out of power-gated mode, power management unit 330 can increase or turn on the supply voltage(s) and/or clock(s) being supplied to the given region 310. Power management unit 330 receives control signals from one or more other units, such as a timer, interrupt unit, processing unit, and the like, for determining when to transition between different power states for the various regions 310A-N of fabric 300.

Figure 4:
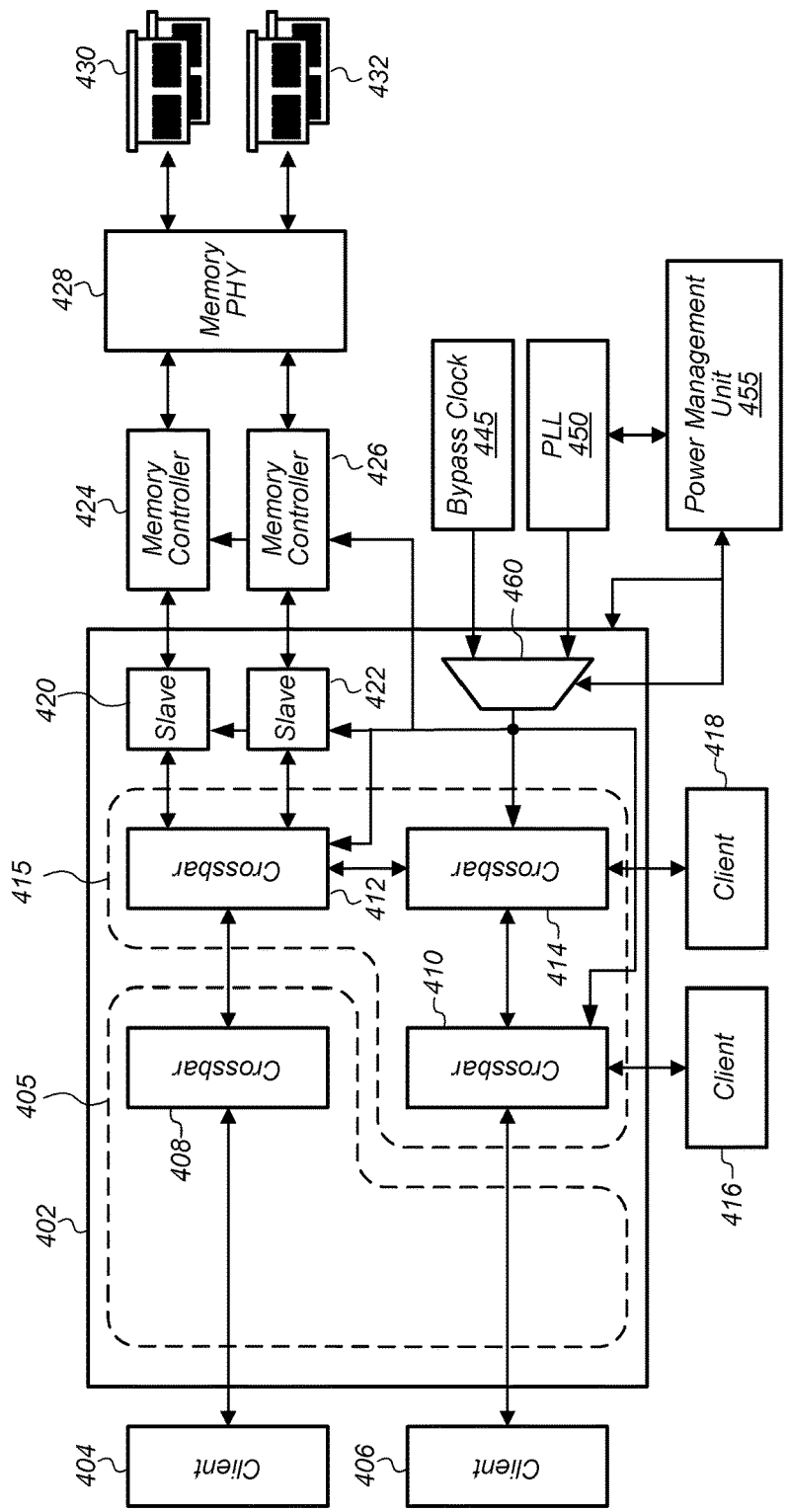
FIG. 4 is a block diagram of one embodiment of a system with a fabric.

Turning now to FIG. 4, a block diagram of one embodiment of a system 400 with a fabric 402 is shown. Fabric 402 of system 400 includes a plurality of regions, with a first region 405 and a second region 415 shown in FIG. 4. In other embodiments, fabric 402 can have other numbers of regions. In one embodiment, region 405 is a non-stutter region with non-stutter client 404 and region 415 is a stutter region with stutter clients 406, 416, and 418. During a stutter mode, both of regions 405 and 415 are power-gated, and then stutter region 415 is woken up periodically to service the stutter clients 406, 416, and/or 418.

During normal operation when fabric 402 is not in stutter mode, a clock (which can, for example, be generated by phase-locked loop (PLL) 450) is supplied to various components of the fabric 402. However, when fabric 402 enters stutter mode, power management unit 455 utilizes multiplexer 460 to couple bypass clock 445 to the various components of fabric 402 and memory controllers 424 and 426. When bypass clock 445 is used as the primary clock for region 415 and memory controllers 424 and 426, power management unit 455 power-gates PLL 450 to save power. Bypass clock 445 can be a reference clock, generated by a separate PLL, or generated in other manners by system 400.

In one embodiment, when client 418 is accessing memory devices 430 and/or 432 via memory PHY 428 during stutter mode, bypass clock 445 will provide the clock to the components in between client 418 and memory devices 430 and 432. Those components which are clocked by bypass clock 445 include crossbars 412 and 415, slaves 420 and 422, and memory controllers 424 and 426. It is noted that bypass clock 445 is available even when stutter region 415 is power-gated. This helps to reduce the exit latency from power-gated mode for stutter region 415 since bypass clock 445 will be available when stutter region 415 is powered up, and the components of stutter region 415 do not have to wait for bypass clock 445 to become active. If PLL 450 provided the clock for region 415, and PLL 450 were powered down during stutter mode, then the components of stutter region 415 would have to wait for PLL 450 to lock before the clock stabilized and became available for these components. This would increase the exit latency and reduce the stutter efficiency of fabric 402.

Figure 5:
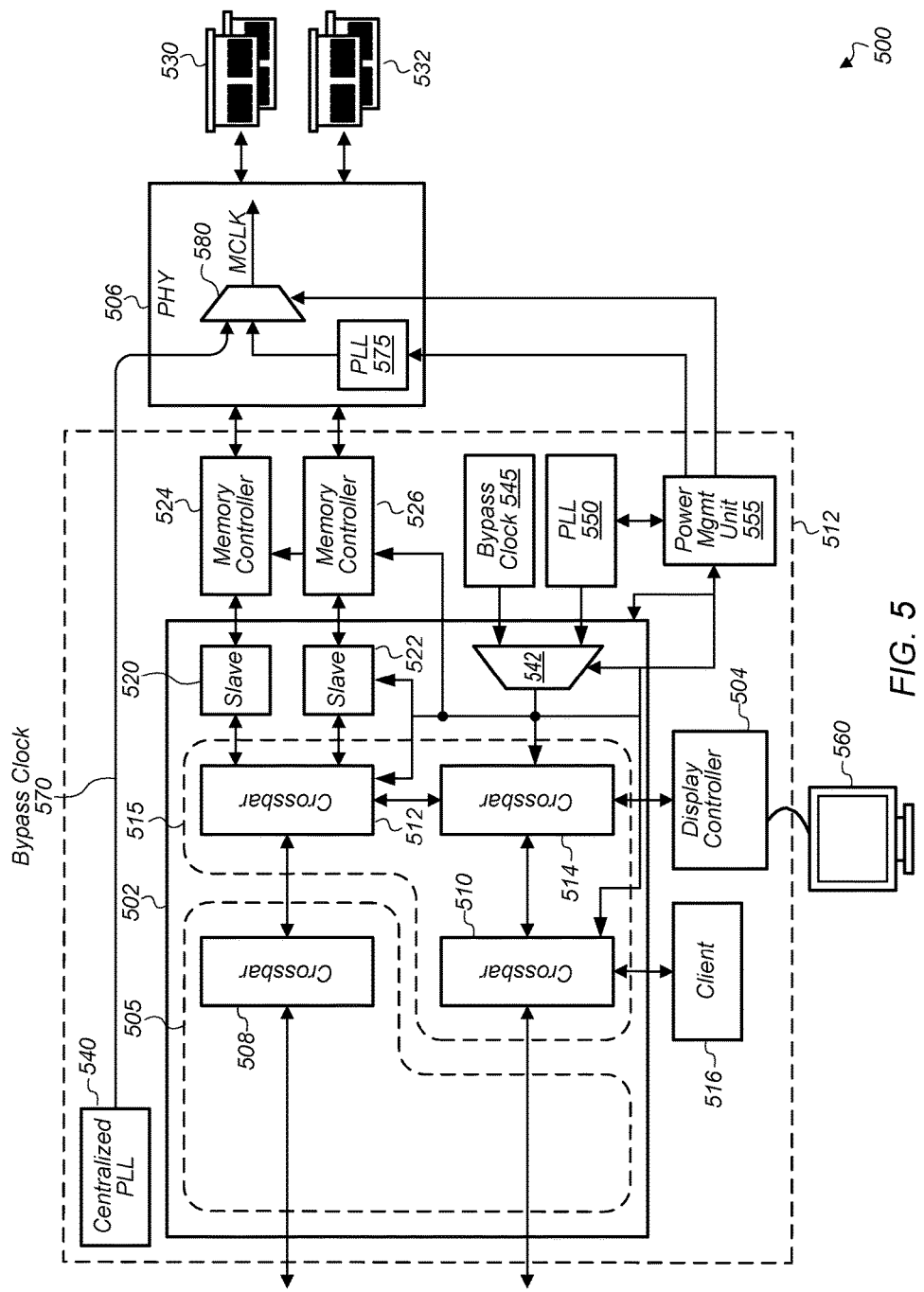
FIG. 5 is a block diagram of another embodiment of a system with a fabric.

Referring now to FIG. 5, a block diagram of another embodiment of a system 500 with a fabric 502 is shown. System 500 includes an integrated circuit (IC) 512 with memory controllers 524 and 526 coupled to memory physical interface circuit (PHY) 506. The memory PHY 506 is configured to facilitate communication between IC 512 and the memory devices 530 and 532. IC 512 includes multiple clients coupled to fabric 502 to provide interconnections between the various components of IC 512. Client 516 is coupled to crossbar 510, display controller 504 is coupled to crossbar 514, and although not shown in FIG. 5, other clients can be coupled to crossbar 508 and crossbar 510.

In one embodiment, fabric 502 includes a non-stutter region 505 and a stutter region 515. In other embodiments, fabric 502 can have other numbers of regions. When fabric 502 goes into stutter mode, power management unit 555 can shut down PLL 550 and utilize bypass clock 545 to drive the other components of IC 512 via multiplexer 542. The components driven by bypass clock 545 during stutter mode include crossbars 510, 512, and 514, slaves 520 and 522, and optionally memory controllers 524 and 526. Additionally, centralized PLL 540 can generate bypass clock 570 as the memory clock (or MCLK) for memory PHY 506 via multiplexer 580. When bypass clock 570 is being utilized as the memory clock for memory PHY 506, power management unit 555 power-gates PLL 575 to save power. By using centralized PLL 540 to generate bypass clock 570 to run memory PHY 506 during stutter mode, the stutter idle state exit latency is reduced, which helps to increase the stutter efficiency. Accordingly, the components of IC 512 do not need to wait for PLL 575 to re-lock when coming out of stutter idle state and into stutter active state to service any stutter clients.

Figure 6:
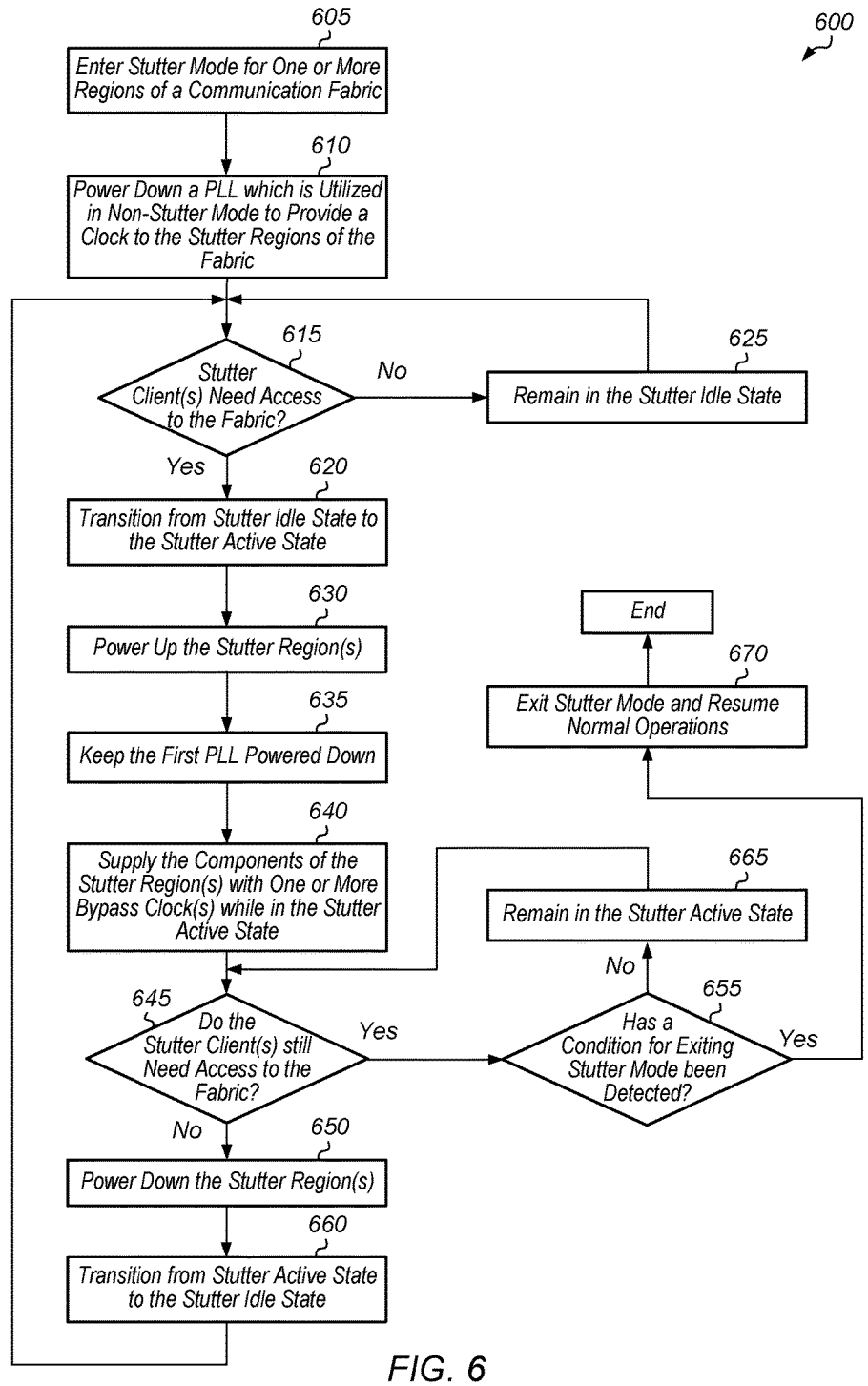
FIG. 6 is a generalized flow diagram illustrating one embodiment of a method for utilizing a bypass clock during stutter mode.
Figure 7:
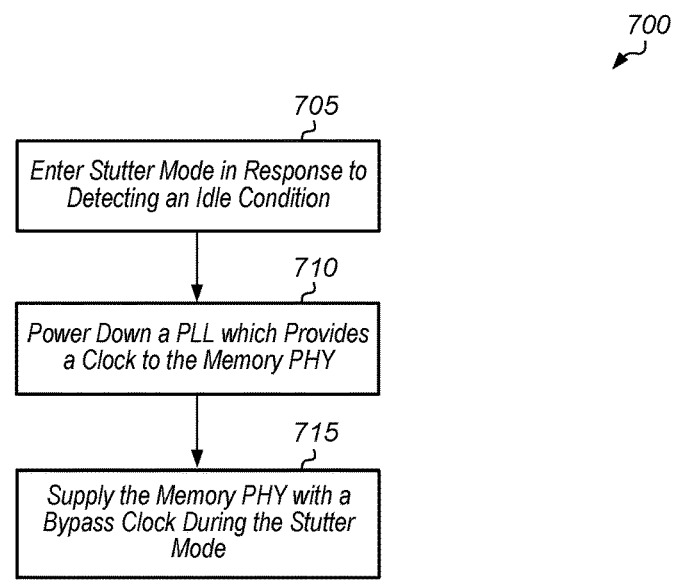
FIG. 7 is a generalized flow diagram illustrating one embodiment of a method for replacing the memory PHY clock with a bypass clock.

Turning now to FIG. 6, one embodiment of a method 600 for utilizing a bypass clock during stutter mode is shown. For purposes of discussion, the steps in this embodiment and those of FIG. 7 are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein are configured to implement method 600.

A system enters stutter mode for one or more regions of a communication fabric (block 605). The stutter mode can involve shutting down the fabric and then periodically waking up one or more stutter regions of the fabric to service stutter clients. While the stutter region(s) are woken up, one or more non-stutter regions of the fabric are kept in a power-gated mode. In one embodiment, the stutter mode consists of two separate states, a stutter idle state and a stutter active state. During the stutter idle state, the stutter region(s) are powered down. During the stutter active state, the stutter region(s) are woken up to service stutter clients. In one embodiment, stutter mode starts in the stutter idle state.

While in the stutter idle state, the system powers down a PLL which is utilized in non-stutter mode to provide a clock to the stutter regions of the fabric (block 610). If any stutter client(s) need access to the fabric (conditional block 615, "yes" leg), then the fabric transitions from the stutter idle state to the stutter active state (block 620). If none of the stutter client(s) need access to the fabric (conditional block 615, "no" leg), then the fabric remains in the stutter idle state (block 625).

While the fabric is in the stutter active state, the stutter region(s) are powered up (block 630) while the first PLL is kept powered down (block 635). Since the first PLL is powered off, the components of the first region are supplied with one or more bypass clocks while in the stutter active state (block 640). If the stutter client(s) no longer need access to the fabric (conditional block 645, "no" leg), then the stutter region(s) of the fabric are powered down (block 650) and then the fabric transitions from stutter active state to stutter idle state (block 660). After block 660, method 600 returns to conditional block 615.

If the stutter client(s) still need access to the fabric (conditional block 645, "yes" leg), then the fabric determines if there is a condition for exiting stutter mode (conditional block 655). If a condition for exiting stutter mode is detected (conditional block 650, "yes" leg), then the fabric exits stutter mode and resumes normal operations (block 670). After block 670, method 600 ends. If a condition for exiting stutter mode is not detected (conditional block 650, "no" leg), the fabric remains in the stutter active state (block 665) and then method 600 returns to conditional block 645.

Referring now to FIG. 7, one embodiment of a method 700 for replacing the memory PHY clock with a bypass clock is shown. A fabric of a computing system enters stutter mode in response to detecting an idle condition (block 705). The fabric can enter the stutter mode to opportunistically reduce power consumption during certain phases of an application or during periods of low activity. While in stutter mode, the system can power down a PLL which provides a clock to the memory PHY (block 710). Also, the system can supply the memory PHY with a bypass clock during the stutter mode (block 715). After block 715, method 700 ends.

Figure 8:
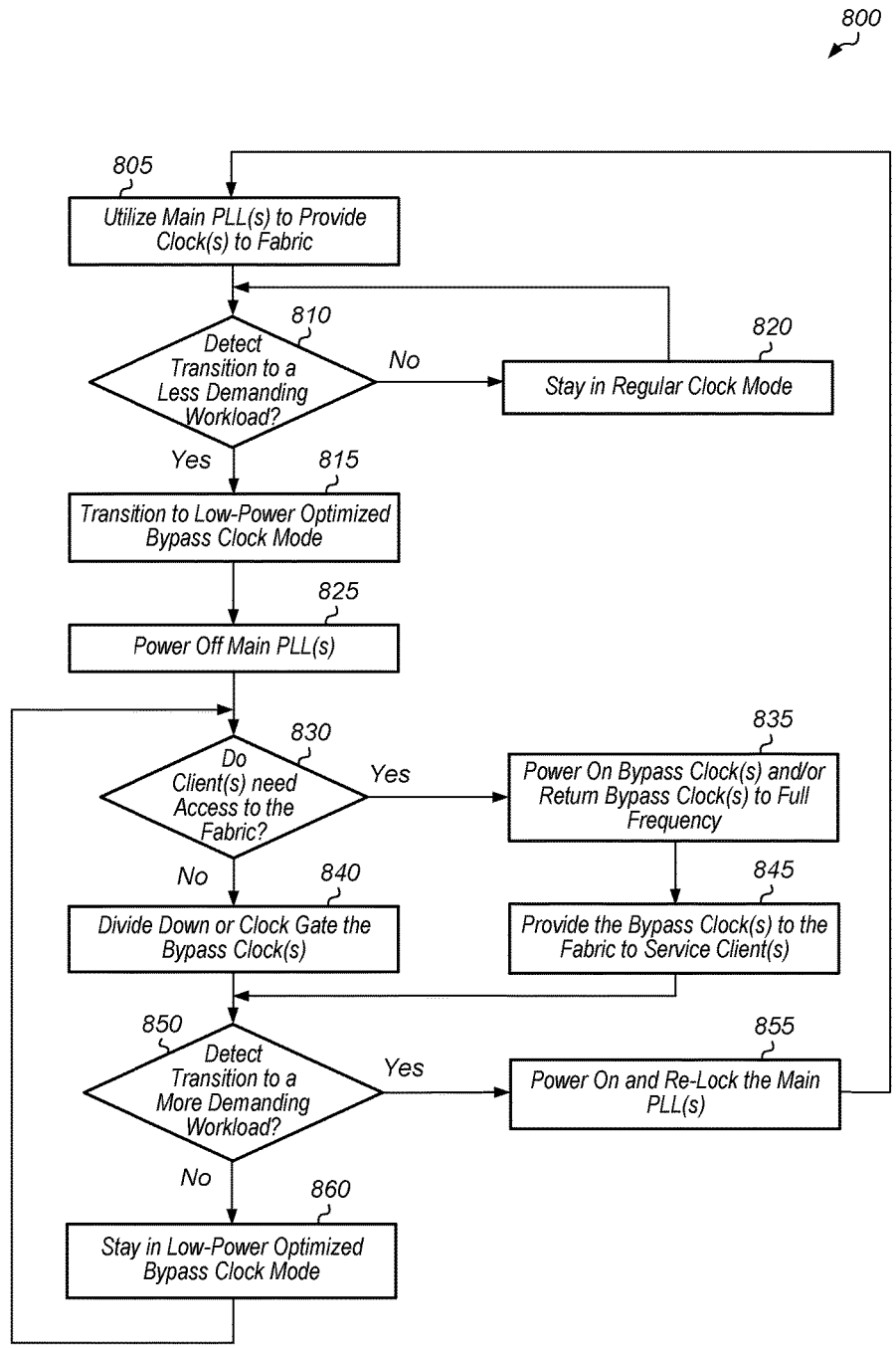
FIG. 8 is a generalized flow diagram illustrating one embodiment of a method for implementing low-power optimized bypass clock mode.

Turning now to FIG. 8, one embodiment of a method 800 for implementing low-power optimized bypass clock mode is shown. A system utilizes one or more main PLLs to provide clock(s) to the various components of a communication fabric (block 805). When the system utilizes the main PLL(s) to generate clock(s) for the fabric components, this can be referred to as "regular clock mode". If the system detects a transition to a less demanding workload (conditional block 810, "yes" leg), then the system transitions to low-power optimized bypass clock mode (block 815). It is noted that a "less demanding workload" can also be referred to as a "low activity workload". For example, software or firmware can recognize an idle system or a system primarily running low power workloads such as video or audio playback. When transitioning to low-power optimized bypass clock mode, the system powers off the main PLL(s) (block 825). By powering off the main PLL(s), this helps to reduce the power consumption of the system. If the system does not detect a transition to a less demanding workload (conditional block 810, "no" leg), then the system stays in regular clock mode (block 820).

After block 825, if any client(s) need access to the fabric (conditional block 830, "yes" leg), then the system powers on one or more bypass clocks and/or returns the bypass clock(s) to full frequency (block 835). It is noted that block 835 can be skipped if the bypass clock(s) are already on and at their full frequency. It is also noted that returning the bypass clock(s) to full frequency can occur more quickly than re-locking a PLL. Also, the system provides the bypass clock(s) to the fabric to service client(s) (block 845). If no client(s) need access to the fabric (conditional block 830, "no" leg), then the system divides down the bypass clock(s) to a lower frequency or the system clock gates the bypass clock(s) (block 840). Next, the system determines if a transition to a more demanding workload (e.g., high resolution video playback) has been detected (conditional block 850). It is noted that a "more demanding workload" can also be referred to as a "high activity workload". If a transition to a more demanding workload has been detected (conditional block 850, "yes" leg), then the system powers on and re-locks the main PLL(s) (block 855). After block 855, method 800 returns to block 805. If a transition to a more demanding workload has not been detected (conditional block 850, "no" leg), the system stays in low-power optimized bypass clock mode (block 860) and then method 800 returns to conditional block 830.

Figure 9:
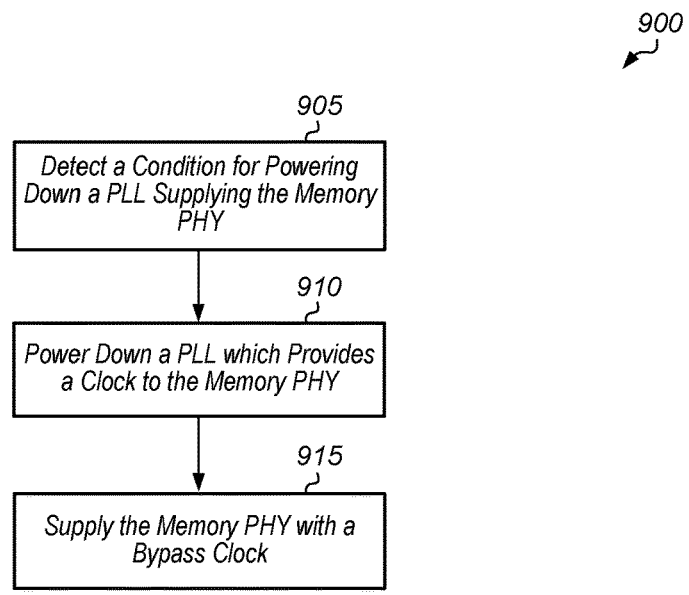
FIG. 9 is a generalized flow diagram illustrating another embodiment of a method for replacing the memory PHY clock with a bypass clock.

Referring now to FIG. 9, another embodiment of a method 900 for replacing the memory PHY clock with a bypass clock is shown. A computing system detects a condition for powering down a PLL supplying the memory PHY (block 905). In one embodiment, the condition can be detecting a transition to a less demanding workload (e.g., video or audio playback). In another embodiment, the condition can be detecting an idle system. In other embodiments, other types of conditions can be detected in block 905. In response to detecting the condition in block 905, the system can power down the PLL which provides a clock to the memory PHY (block 910). Also, the system can supply the memory PHY with a bypass clock (block 915). After block 915, method 900 ends.

In various embodiments, program instructions of a software application are used to implement the methods and/or mechanisms described herein. For example, program instructions executable by a general or special purpose processor are contemplated. In various embodiments, such program instructions can be represented by a high level programming language. In other embodiments, the program instructions can be compiled from a high level programming language to a binary, intermediate, or other form. Alternatively, program instructions can be written that describe the behavior or design of hardware. Such program instructions can be represented by a high-level programming language, such as C. Alternatively, a hardware design language (HDL) such as Verilog can be used. In various embodiments, the program instructions are stored on any of a variety of non-transitory computer readable storage mediums. The storage medium is accessible by a computing system during use to provide the program instructions to the computing system for program execution. Generally speaking, such a computing system includes at least one or more memories and one or more processors configured to execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A system comprising:
   one or more processing units;
   one or more memory devices;
   a communication fabric comprising a plurality of domains that are configured to be power-gated;
   a first clock circuit configured to provide a first clock signal to the communication fabric; and
   a first bypass clock circuit, different from the first clock circuit, configured to provide a first bypass clock signal to the communication fabric;
   wherein the system is configured to:
      during an idle state, power down a subset of the plurality of domains of the communication fabric and disable the first clock signal to the subset of the plurality of domains; and
      enter an active state responsive to determining a processing unit requests access to a first domain of the subset of the plurality of domains, and in response to entering the active state:
         power up the first domain; and
         supply one or more components of the first domain with the first bypass clock signal without re-enabling the first clock signal.

2. The system as recited in claim 1, wherein the system further comprises a memory interface and a second clock circuit configured to provide a second clock signal to the memory interface, wherein the system is further configured to:
   supply the memory interface with a second bypass clock signal different from the second clock signal during the active state; and
   keep the second clock circuit powered down during the active state.

3. The system as recited in claim 1, wherein the one or more components of the first domain comprise one or more crossbars.

4. The system as recited in claim 1, wherein the system further comprises a display controller coupled to a second domain of the subset of the plurality of domains, and wherein the second domain is configured to service requests from the display controller during the active state.

5. The system as recited in claim 1, wherein while in the idle state, the first domain is configured to store a state of the first domain, wherein said state comprises one or more of address maps, routing tables, buffer allocation information, and configuration data.

6. The system as recited in claim 1, wherein the system is further configured to keep the first bypass clock on during both the idle state and the active state, and wherein a latency of waking the first domain from the idle state and using the first bypass clock signal is less than waking the first domain from the idle state and using the first clock signal.

7. The system as recited in claim 1, wherein the system is further configured to:
   generate a plurality of bypass clocks; and
   select a given bypass clock of the plurality of bypass clocks to supply a clock signal to the first domain responsive to determining the given bypass clock will enable the first domain to increase an amount of bandwidth supplied to a first client.

8. A method comprising:
   generating a first clock signal for conveyance to a communication fabric comprising a plurality of domains that are configured to be power-gated;
   generating a first bypass clock signal, different from the first clock signal, for conveyance to the communication fabric;
   during an idle state, powering down a a subset of the plurality of domains of the communication fabric and disabling the first clock signal to the subset of the plurality of domains; and
   entering an active state responsive to determining a processing unit requests access to a first domain of the subset of the plurality of domains, and in response to entering the active state:
      powering up the first domain; and
      supplying one or more components of the first domain with the first bypass clock signal without re-enabling the first clock signal.

9. The method as recited in claim 8, further comprising:
   supplying a memory interface with a second bypass clock signal different from a second clock signal during the active state, wherein the second clock signal is generated by a second clock circuit; and
   keeping the second clock circuit powered down during the active state.

10. The method as recited in claim 8, wherein the one or more components of the first domain of the communication fabric comprise one or more crossbars.

11. The method as recited in claim 8, further comprising a second domain of the subset of the plurality of domains servicing requests from a display controller during the active state.

12. The method as recited in claim 8, wherein while in the idle state, the method further comprises the first domain storing a state of the first domain, wherein said state comprises one or more of address maps, routing tables, buffer allocation information, and configuration data.

13. The method as recited in claim 8, further comprising keeping the first bypass clock on during both the idle state and the active state, and wherein a latency of waking the first domain from an idle state and using the first bypass clock signal is less than waking the first domain from the idle state and using the first clock signal.

14. The method as recited in claim 8, further comprising:
   generating a plurality of bypass clocks;
   selecting a given bypass clock of the plurality of bypass clocks to supply the first region of the communication fabric responsive to determining the given bypass clock will enable the first region of the communication fabric to increase an amount of bandwidth supplied to a first client.

15. An apparatus comprising:
   a communication fabric comprising a plurality of domains that are configured to be power-gated; and
   a first clock circuit configured to provide a first clock signal to the communication fabric;
   a first bypass clock circuit, different from the first clock circuit, configured to provide a first bypass clock signal to the communication fabric;
   wherein the apparatus is configured to:
      during an idle state, power down a subset of the plurality of domains of the communication fabric and disable the first clock signal to the subset of the plurality of domains; and
      enter an active state responsive to determining a processing unit requests access to a first domain of the subset of the plurality of domains, and in response to entering the active state:

power up the first domain; and supply one or more components of the first domain with the first bypass clock signal without re-enabling the first clock signal.

16. The apparatus as recited in claim 15, wherein the apparatus further comprises a memory interface and a second clock circuit configured to provide a second clock signal to the memory interface, wherein the apparatus is further configured to:

supply the memory interface with a second bypass clock signal different from the second clock signal during the active state; and keep the second clock circuit powered down during the active state.

17. The apparatus as recited in claim 15, wherein the one or more components of the first domain comprise one or more crossbars.

18. The apparatus as recited in claim 15, wherein the apparatus further comprises a display controller coupled to a second domain of the subset of the plurality of domains, and wherein the second domain is configured to service requests from the display controller during the active state.

19. The apparatus as recited in claim 15, wherein while in the idle state, the first domain is configured to store a state of the first domain, wherein said state comprises one or more of address maps, routing tables, buffer allocation information, and configuration data.

20. The apparatus as recited in claim 15, wherein the apparatus is further configured to keep the first bypass clock on during both the idle state and the active state, and wherein a latency of waking the first region from an idle state and using the first bypass clock signal is less than waking the first region from the idle state and using the first clock signal.

\* \* \* \* \*